United States Patent
Wu et al.

(10) Patent No.: US 6,570,263 B1
(45) Date of Patent: May 27, 2003

(54) STRUCTURE OF PLATED WIRE OF FIDUCIAL MARKS FOR DIE-DICING PACKAGE

(75) Inventors: Kai-Chiang Wu, Hsinchu (TW); Yi-Liang Peng, Hsinchu Hsien (TW); Ya-Yun Cheng, Hsinchu (TW)

(73) Assignee: Vate Technology Co., Ltd., Hsinchu (TW)

( * ) Notice: Subject to any disclaimer, the term of this patent is extended or adjusted under 35 U.S.C. 154(b) by 0 days.

(21) Appl. No.: 10/162,912

(22) Filed: Jun. 6, 2002

(51) Int. Cl.[7] .................................................. H01L 23/544
(52) U.S. Cl. .................... 257/797; 257/620; 257/48; 438/462
(58) Field of Search ................... 257/797, 620, 257/48, 723; 438/462

(56) References Cited

U.S. PATENT DOCUMENTS

| | | | | |
|---|---|---|---|---|
| 5,777,392 A | * | 7/1998 | Fujii | 257/797 |
| 5,990,567 A | * | 11/1999 | Tseng et al. | 257/797 |
| 6,329,700 B1 | * | 12/2001 | Ishimura et al. | 257/620 |
| 6,350,548 B1 | * | 2/2002 | Leidy et al. | 430/22 |
| 6,200,824 B1 | * | 3/2002 | Hashimoto | 438/15 |
| 6,373,548 B1 | * | 4/2002 | Kim | 257/797 |
| 6,400,037 B1 | * | 6/2002 | Omizo | 257/797 |

FOREIGN PATENT DOCUMENTS

| | | | | |
|---|---|---|---|---|
| JP | 1-137238 | * | 5/1989 | 257/797 |
| JP | 2-307206 | * | 12/1990 | 257/632 |
| JP | 6-204101 | * | 7/1994 | 257/797 |

* cited by examiner

Primary Examiner—Jasmine J B Clark
(74) Attorney, Agent, or Firm—Rosenberg, Klein & Lee

(57) ABSTRACT

The present invention provides a design structure of an plated wire of a fiducial mark for a die-dicing package. In the present structure, a cutting line is positioned between each two adjacent ball grid array (BGA) chips. There is configured a solder mask opening at the edge connecting region of the cutting lines. A fiducial mark is positioned in the opening of each BGA chip, wherein the fiducial mark is close to the cutting line and positioned a plated wire therein to pull from the fiducial mark to out the opening and to connect to the plated wire of the cutting line. So as all the plated wires utilizing the coverage of the solder mask can be entirely cut without the pulling problem from the cutter. The present invention provides a new design structure of the plated wire to overcome the burr effect of prior die dicing so as to enhance the product efficiency and decrease the manufacturing cost.

2 Claims, 6 Drawing Sheets

STRUCTURE OF PLATED WIRE OF FIDUCIAL MARKS FOR DIE-DICING PACKAGE

BACKGROUND OF THE INVENTION

1. Field of the Invention

The present invention generally relates to a chip-array ball grid array (CA BGA) package, and more particularly relates to a structure of the design of a plated wire for the die dicing package.

2. Description of the Prior Art

In the package process of the integrated circuits manufacture, the die dicing method of the chip-array ball grid array utilizes the slaw type technology. So, in the backside of the substrate, the fiducial mark is designed for using as the fixing fiducial point and for identifying the specific of the product. Hence, the accuracy of the position and shape of the fiducial mark is seriously required.

Referring to the FIG. 1, chip array 30 is configured with grid array solder ball 22 thereon. In the design of the fiducial mark 16, in order to match the process tolerance of the substrate and the consideration of the substrate layout, fiducial mark 16 is generally very close to the cutting line 11 land cutting line 13. Besides, the solder mask opening 18 is extended to the plate wires 12, 14 of the cutting line to make the fiducial mark 16 achieve the required accuracy of the cutting process. In the solder mask opening 18, the fiducial mark 16 is designed to connect to the shortest plated wire 20 of the plated wires 14 of the cutting line, such as shown in the cutaway view of the FIG. 2. The front side and the backside of the substrate 10 are coated with solder mask 24, 26. Owing to the plated wire 20 of the solder mask opening 18 is exposed, so the cutter will cause the burr problem by naturally polishing and consume under the structure of this plated wire design. Referring to the FIG. 3, in the die dicing process, the cutter is consumed and become un-sharp, so the plated wire 20 is pulled by the cutter and causing the burr effect. Furthermore, the burr effect will cause the problem in the following processes, such as the final test, the surface mount technology (SMT), and etc.

In order to solve the burr problem, the operator usually has to shut down the machine to replace the cutter and need to polish the consumed cutter for cutting the plated wire. So as the normal life of the cutter is shortened and it has to increase the safety storage of the cutter. It increases the cost of polishing the cutter and the rework cost of the die dicing burr product. Furthermore, it substantially decreases the product efficiency and increases the manufacture cost.

Obviously, the main spirit of the invention is to provide a new plated wire design structure of a fiducial mark of the substrate, and then some disadvantages of well-known technology are overcome.

SUMMARY OF THE INVENTIONS

The primary object of the invention is to provide a new structure of the plated wires of the fiducial marks of the substrate which is utilizing the coverage of the solder mask to solve the burr effect of the die dicing without the pulling problem of the plated wires by the cutter.

Another object of the invention is to provide a structure of the plated wire of the fiducial mark of the substrate, which can enhance the process efficiency without shutting down the machine for polishing the cutter, and without the problem of the defect burr product.

A further object of the invention is to provide a structure of the plated wire of the fiducial mark of the substrate, which can decrease the manufacture cost by elongating the use life of the cutter and reducing the polishing cost and the rework cost of the defect burr product.

In order to achieve previous objects, the present invention is to pull the plated wire connecting with the fiducial mark out of the opening region, and then to the plated wire of the cutting line. So as utilizing the coverage of the solder mask, the plated wire can be accurately cut without pulling by the cutter to solve the burr problem of the prior art.

Other aspects, features, and advantages of the present invention will become apparent as the invention becomes better understood by reading the following description in conjunction with the accompanying drawings.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention provides a pull structure of the plated wire of the fiducial mark of the substrate for solving the burr problem causing from the die dicing package of the chip array ball grid array. In the present invention, the path of the plated wire is pulling out from the opening region and then to connect to the plated wire of the cutting line to utilize the coverage of the solder mask to achieve the accurately cutting of the plated wires without pulling by the cutter.

Figure 1:
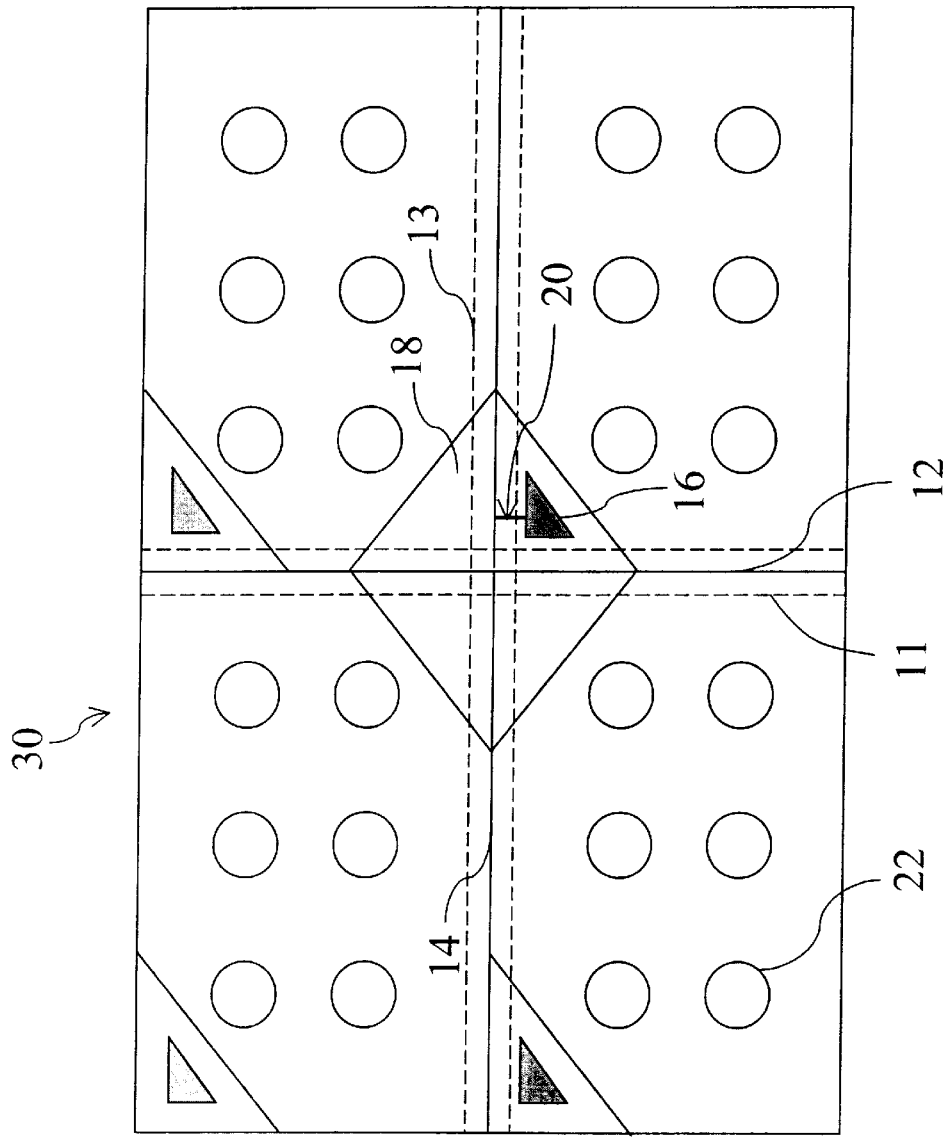
FIG. 1 is a schematic representation of the connection way of the plated wires, in accordance with prior techniques.
Figure 2:
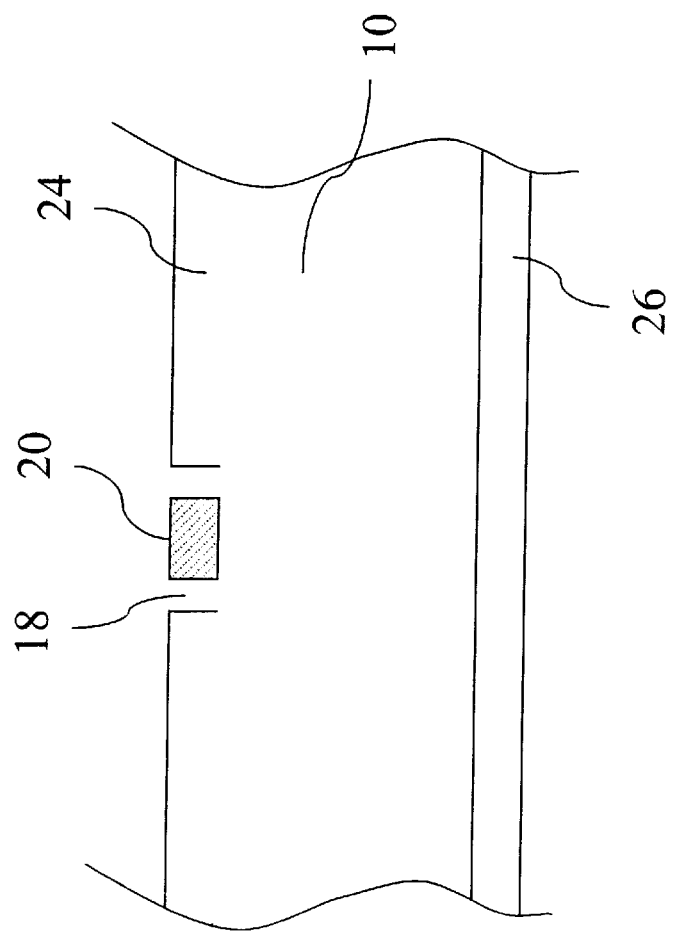
FIG. 2 is a cutaway view schematic representation of the connection way of the plated wires, in accordance with prior techniques.
Figure 3:
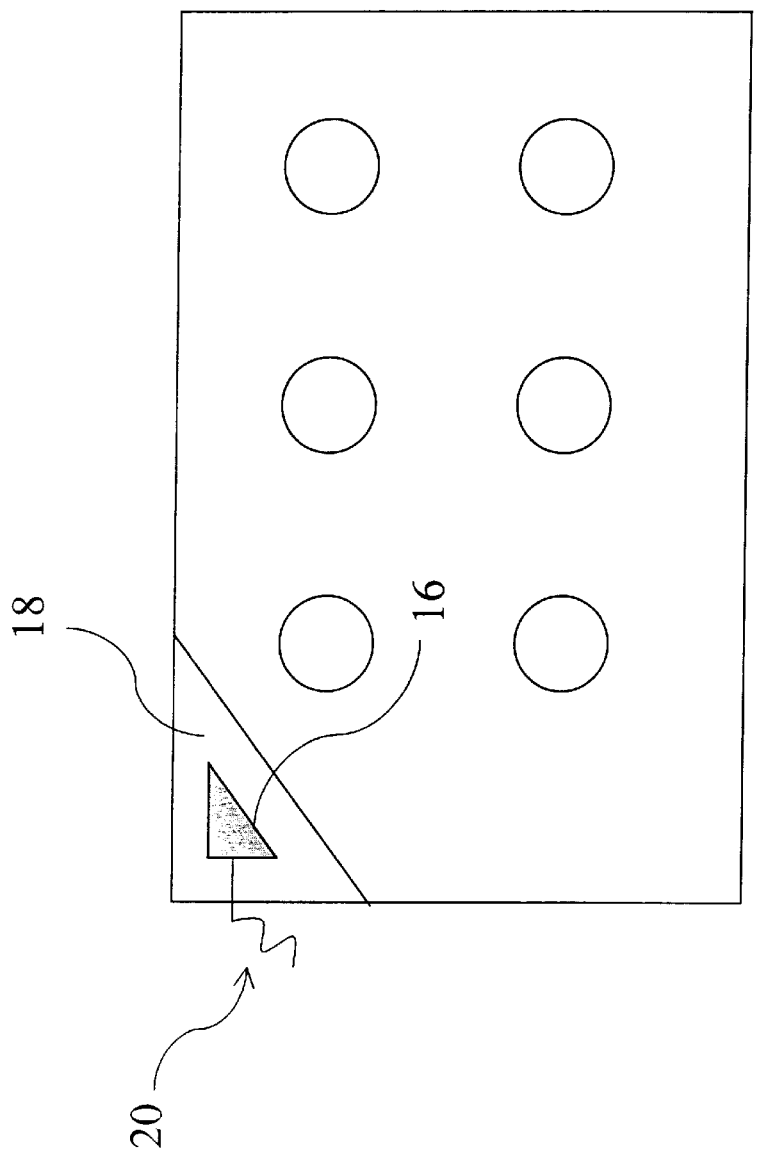
FIG. 3 is a schematic representation of the burr effect after die dicing, in accordance with prior techniques.
Figure 4:
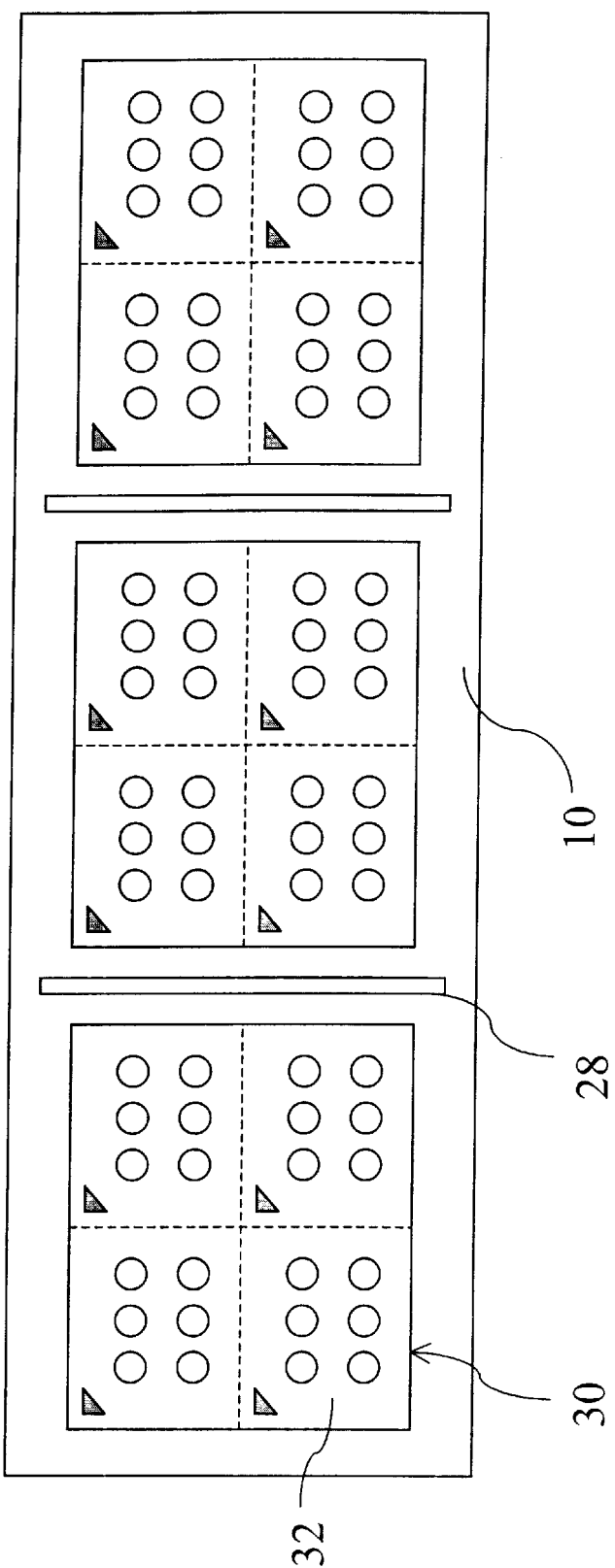
FIG. 4 is a schematic representation of the backside of the substrate of the ball grid array package, in accordance with the present invention.

The whole structure of the present invention is as shown in the FIG. 4. A chip array 30 of ball grid array is formed on a substrate 10. Each unit is separated with a slot 28 and the structure of the single chip array 30 is detailed shown in the FIG. 5.

Figure 5:
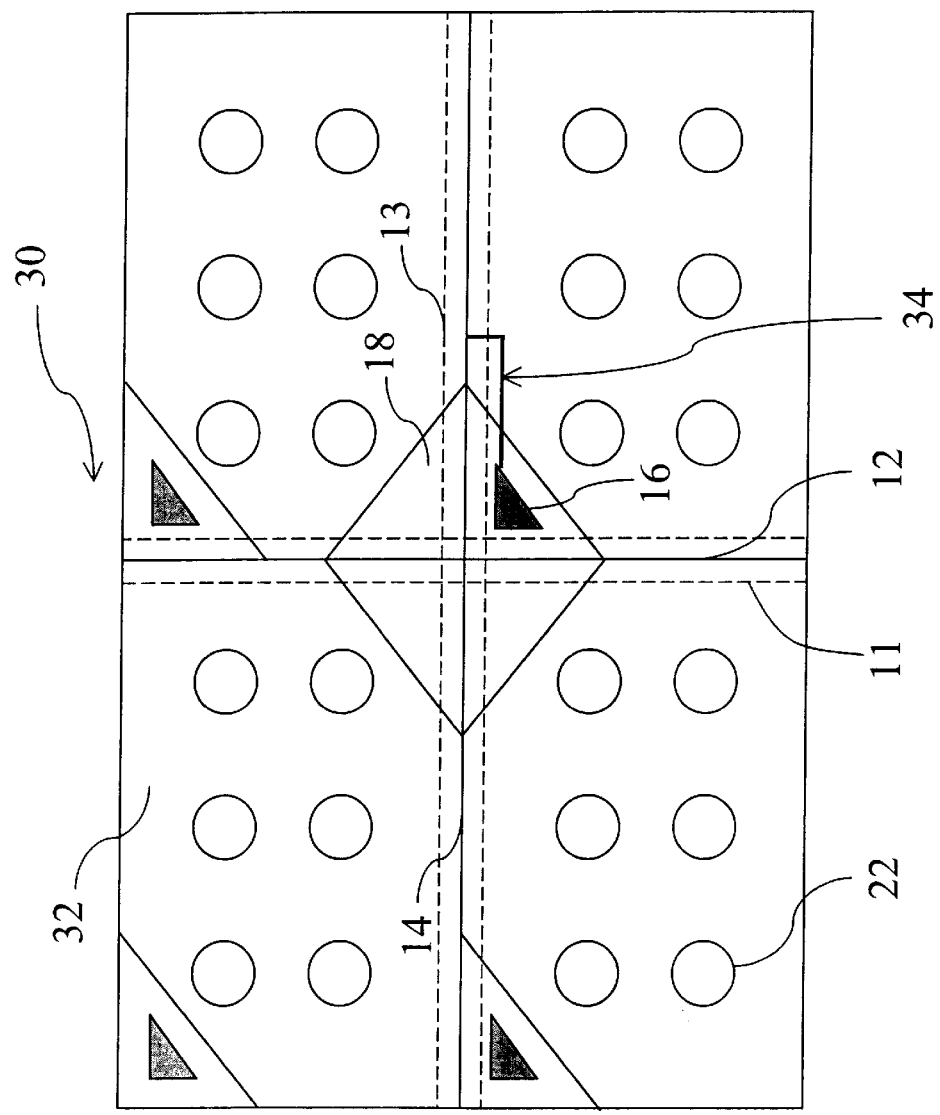
FIG. 5 is a schematic representation of the connection way of the plated wires, in accordance with the present invention.

Referring to the FIG. 5, the chip array 30 comprises four ball grid array 32 (or more than four), which is positioned a plurality of solder ball 22 of matrix array. In the preparation of the die dicing step, a cutting line 11 and a cutting line 13 are positioned between each two adjacent ball grid array chips 32 and a solder mask opening 18 is positioned at the adjacent corner of those four adjacent ball grid array chips 32. Wherein the solder mask opening 18 is extended to plated wires 12, 14 of the cutting line. Besides, each one of the grid array chips 32 is configured a fiducial mark 16 which is in the solder mask opening 18 and close to the cutting lines 11, 13, wherein the fiducial mark 16 is positioned with a plated wire 34 connecting to the plated wire 14 of the cutting line.

Figure 6:
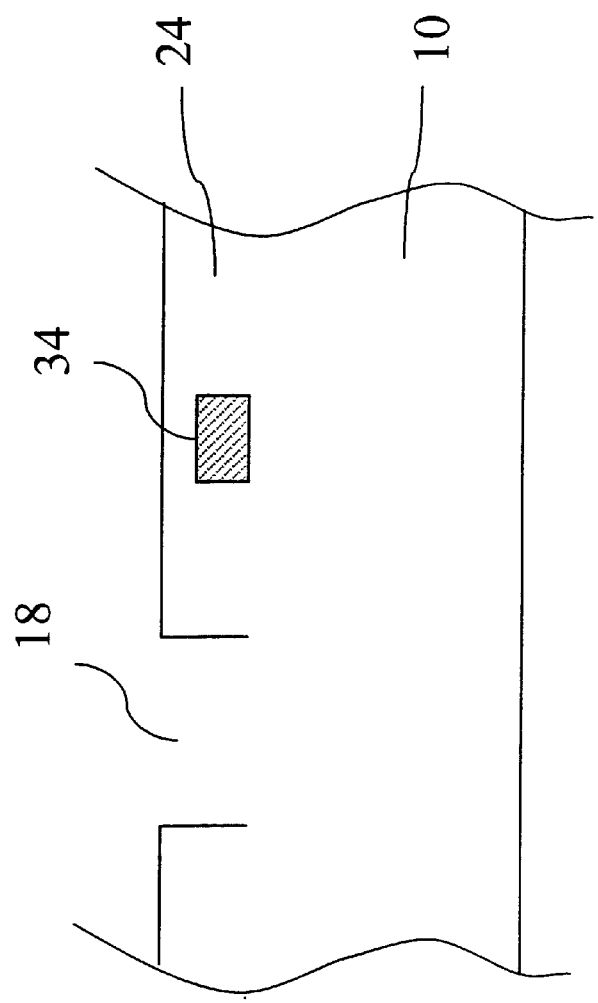
FIG. 6 is a cutaway view schematic representation of the partial region of the plated wires, in accordance with the present invention.

In the forgoing pull method of the plated wire 34, after pulling the plated wire from the fiducial mark 16 to out of the solder mask opening 18, the plated wire 34 is positioned under the cover layer and then is connected to the plated wire 14 of the cutting line to complete the plated design of the dicing alignment. Referring to the FIG. 6, the plated wires in the cutting line 13 region of the backside of the substrate 10 is covered by a cover layer of a solder mask layer 24, wherein the solder mask layer 24 is usually made of the epoxy resin. Owing to the fiducial mark 16 and the plated wire 34 are early formed, then a solder mask layer 25 is deposited, and following an opening is formed on the fiducial mark 16 region, so the solder mask layer 24 of the cutting line 13 can cover the under plated wire 34 to achieve the protect effect of the plated wire 34.

To sum up the forgoing, the present invention utilizes to pull the plated wire out of the opening region, then to connect to the plated wire of the cutting line, and to use the solder mask layer to cover thereon. Hence, no matter the cutter is sharp or not, the present design can accurately cut the plated wire by the coverage of the solder mask layer to overcome the burr problem causing from pulling the plated wire by the cutter. So as the present invention can elongate the use life of the cutter without shutting down the machine for changing the cutter and can decrease the safety storage of the cutter. Furthermore, the present invention decreases the cost of polishing the cutter and the rework cost of the die dicing burr product. The present invention substantially increases the product efficiency and decreases the manufacture cost.

Of course, it is to be understood that the invention described herein need not be limited to these disclosed embodiments. Various modification and similar changes are still possible within the spirit of this invention. In this way, all such variations and modifications are included within the intended scope of the invention and the scope of this invention should be defined by the appended claims.

What is claimed is:

1. A structure of a design of a plated wire of a fiducial mark for a die-dicing package, said structure comprising:

a substrate positioned a chip-array of a grid-array thereon, wherein a cutting line is configured between each two adjacent ball grid array (BGA) chips;

a plurality of openings positioned at an adjacent corner of said each two BGA chips and extending to a plated wire of said cutting line;

a plurality of fiducial marks positioned in said openings of each said BGA chip and close to said cutting line; and, a plurality of plated wires, wherein said plated wires are pulled from said fiducial marks to out of said openings to extend under a cover layer and to elongate to said plated wire of said cutting line.

2. The structure of the design of the plated wire of the fiducial mark of the die dicing package according to claim 1, wherein said cover layer is a solder mask layer.

\* \* \* \* \*